United States Patent
Tsai et al.

(10) Patent No.: US 10,312,139 B2
(45) Date of Patent: Jun. 4, 2019

(54) INTERCONNECT STRUCTURE HAVING AN ETCH STOP LAYER OVER CONDUCTIVE LINES

(71) Applicant: Taiwan Semiconductor Manufacturing Company, Ltd., Hsin-Chu (TW)

(72) Inventors: Cheng-Hsiung Tsai, Miaoli County (TW); Chung-Ju Lee, Hsinchu (TW); Shau-Lin Shue, Hsinchu (TW); Tien-I Bao, Taoyuan County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/626,839

(22) Filed: Jun. 19, 2017

(65) Prior Publication Data

US 2017/0287775 A1    Oct. 5, 2017

Related U.S. Application Data

(63) Continuation of application No. 14/751,543, filed on Jun. 26, 2015, now Pat. No. 9,685,368.

(51) Int. Cl.
*H01L 23/522* (2006.01)
*H01L 21/768* (2006.01)
*H01L 23/528* (2006.01)

(52) U.S. Cl.
CPC .. *H01L 21/76829* (2013.01); *H01L 21/76802* (2013.01); *H01L 21/76834* (2013.01);
(Continued)

(58) Field of Classification Search
CPC .................................................. H01L 27/76829
See application file for complete search history.

(56) References Cited

U.S. PATENT DOCUMENTS 5,757,077 A * 5/1998 Chung .................. H01L 21/768
                                                    257/736
5,942,801 A * 8/1999 Tran .................. H01L 21/76801
                                                    257/758

(Continued)

FOREIGN PATENT DOCUMENTS

KR    20040071527 A    8/2004
KR    20050059853 A    6/2005
(Continued)

OTHER PUBLICATIONS

Office Action dated Sep. 20, 2016, Application No. 10-2015-0163931, Translation provided, 15 pages.

*Primary Examiner* — William A Harriston
(74) *Attorney, Agent, or Firm* — Haynes and Boone, LLP

(57) ABSTRACT

A multilayer interconnect structure for integrated circuits includes a first dielectric layer over a substrate and a conductive line partially exposed over the first dielectric layer. The structure further includes an etch stop layer over both the first dielectric layer and the exposed conductive line, and a second dielectric layer over the etch stop layer. The second dielectric layer and the etch stop layer provide a via hole that partially exposes the conductive line. The structure further includes a via disposed in the via hole, and another conductive line disposed over the via and coupled to the conductive line through the via. Methods of forming the multilayer interconnect structure are also disclosed. The etch stop layer reduces the lateral and vertical etching of the first and second dielectric layers when the via hole is misaligned due to overlay errors.

20 Claims, 17 Drawing Sheets

(52) U.S. Cl.
CPC .. *H01L 21/76877* (2013.01); *H01L 21/76885* (2013.01); *H01L 23/5226* (2013.01); *H01L 23/5283* (2013.01); *H01L 21/76807* (2013.01)

(56) References Cited

U.S. PATENT DOCUMENTS

| | | | |
|---|---|---|---|
| 6,184,121 B1 | 2/2001 | Buchwalter et al. | |
| 6,297,110 B1 * | 10/2001 | Chan | H01L 21/76802 |
| | | | 257/E21.577 |
| 6,350,672 B1 | 2/2002 | Sun | |
| 6,483,153 B1 * | 11/2002 | Hui | H01L 21/76895 |
| | | | 257/288 |
| 6,537,902 B1 * | 3/2003 | Orita | H01L 21/31116 |
| | | | 257/640 |
| 6,939,812 B2 * | 9/2005 | Broekaart | H01L 21/76802 |
| | | | 257/382 |
| 7,667,271 B2 | 2/2010 | Yu et al. | |
| 7,910,453 B2 | 3/2011 | Xu et al. | |
| 7,968,431 B2 | 6/2011 | Hsieh et al. | |
| 8,106,513 B2 | 1/2012 | Gambino et al. | |
| 8,362,575 B2 | 1/2013 | Kwok et al. | |
| 8,367,498 B2 | 2/2013 | Chang et al. | |
| 8,377,779 B1 | 2/2013 | Wang | |
| 8,399,931 B2 | 3/2013 | Liaw et al. | |
| 8,440,517 B2 | 5/2013 | Lin et al. | |
| 8,497,528 B2 | 7/2013 | Lee et al. | |
| 8,610,240 B2 | 12/2013 | Lee et al. | |
| 8,652,894 B2 | 2/2014 | Lin et al. | |
| 8,680,576 B2 | 3/2014 | Ching et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,796,759 B2 | 8/2014 | Perng et al. | |
| 8,809,139 B2 | 8/2014 | Huang et al. | |
| 8,816,444 B2 | 8/2014 | Wann et al. | |
| 8,823,065 B2 | 9/2014 | Wang et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,860,148 B2 | 10/2014 | Hu et al. | |
| 9,312,222 B2 * | 4/2016 | Ting | H01L 23/5329 |
| 9,466,722 B2 * | 10/2016 | Liu | H01L 21/82342 |
| 9,478,636 B2 | 10/2016 | Chen et al. | |
| 2002/0179960 A1 | 12/2002 | Kang et al. | |
| 2003/0038371 A1 * | 2/2003 | Hsue | H01L 21/76838 |
| | | | 257/762 |
| 2004/0253811 A1 * | 12/2004 | Lee | H01L 21/02063 |
| | | | 438/633 |
| 2005/0130369 A1 | 6/2005 | Kim et al. | |
| 2007/0205507 A1 | 9/2007 | Chang et al. | |
| 2008/0116503 A1 | 5/2008 | Tsurumi et al. | |
| 2008/0224238 A1 | 9/2008 | Kanakasabapathy et al. | |
| 2011/0068407 A1 | 3/2011 | Yeh et al. | |
| 2011/0076844 A1 | 3/2011 | Henrich et al. | |
| 2013/0011983 A1 | 1/2013 | Tsia et al. | |
| 2013/0273729 A1 | 10/2013 | Hempel et al. | |
| 2013/0328111 A1 | 12/2013 | Xie et al. | |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0252412 A1 | 9/2014 | Tsai et al. | |
| 2014/0312508 A1 * | 10/2014 | Boyanov | H01L 23/5329 |
| | | | 257/774 |
| 2014/0332962 A1 | 11/2014 | Lee et al. | |
| 2015/0171084 A1 | 6/2015 | Lin et al. | |
| 2015/0332962 A1 | 11/2015 | Chen et al. | |
| 2016/0104704 A1 | 4/2016 | Fang et al. | |
| 2016/0190305 A1 | 6/2016 | JangJian et al. | |
| 2016/0379871 A1 | 12/2016 | Tsai et al. | |

FOREIGN PATENT DOCUMENTS

| | | |
|---|---|---|
| TW | 200713553 | 4/2007 |
| TW | 201511101 | 3/2015 |

* cited by examiner

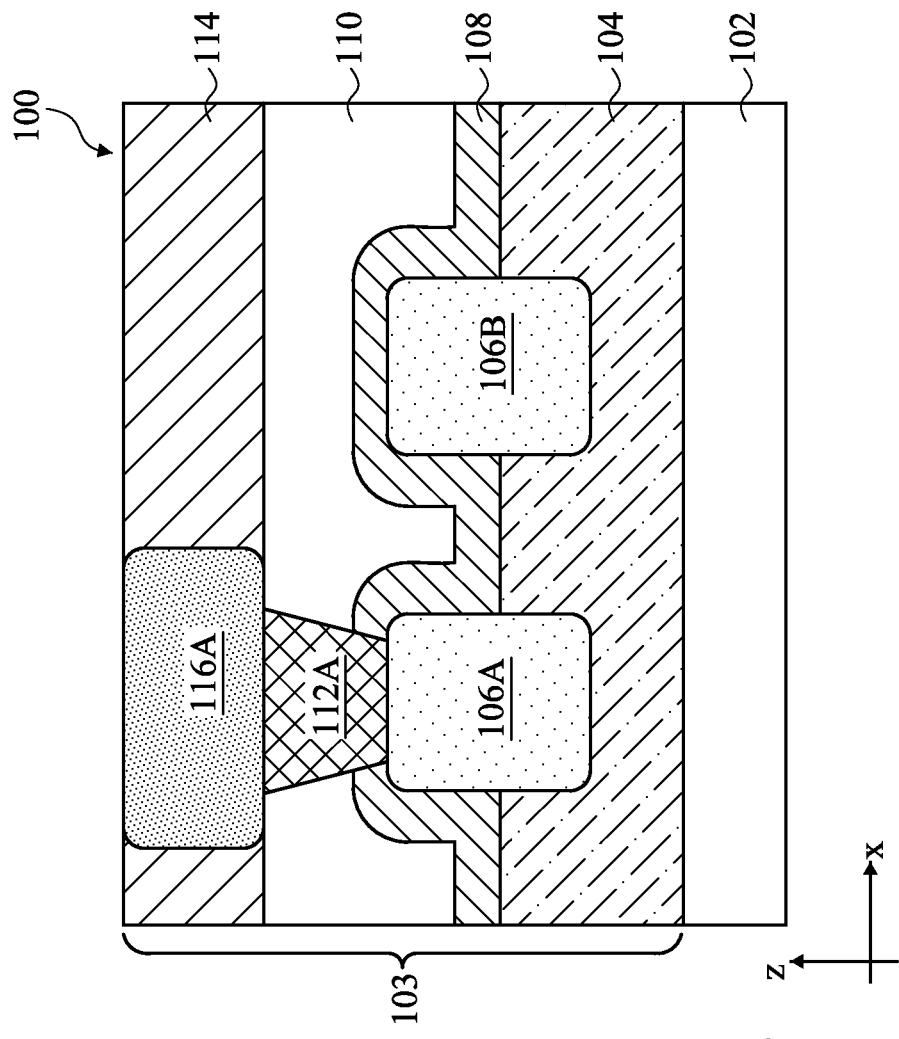
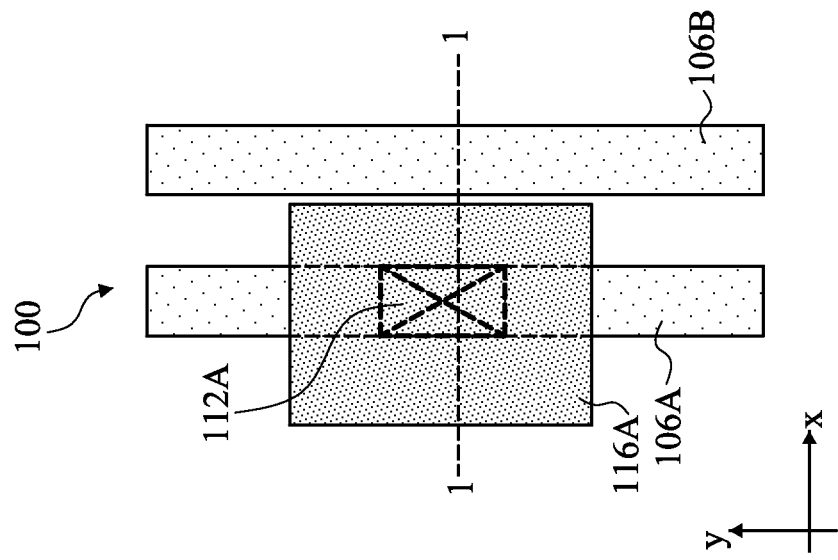
Fig. 1B
Fig. 1A

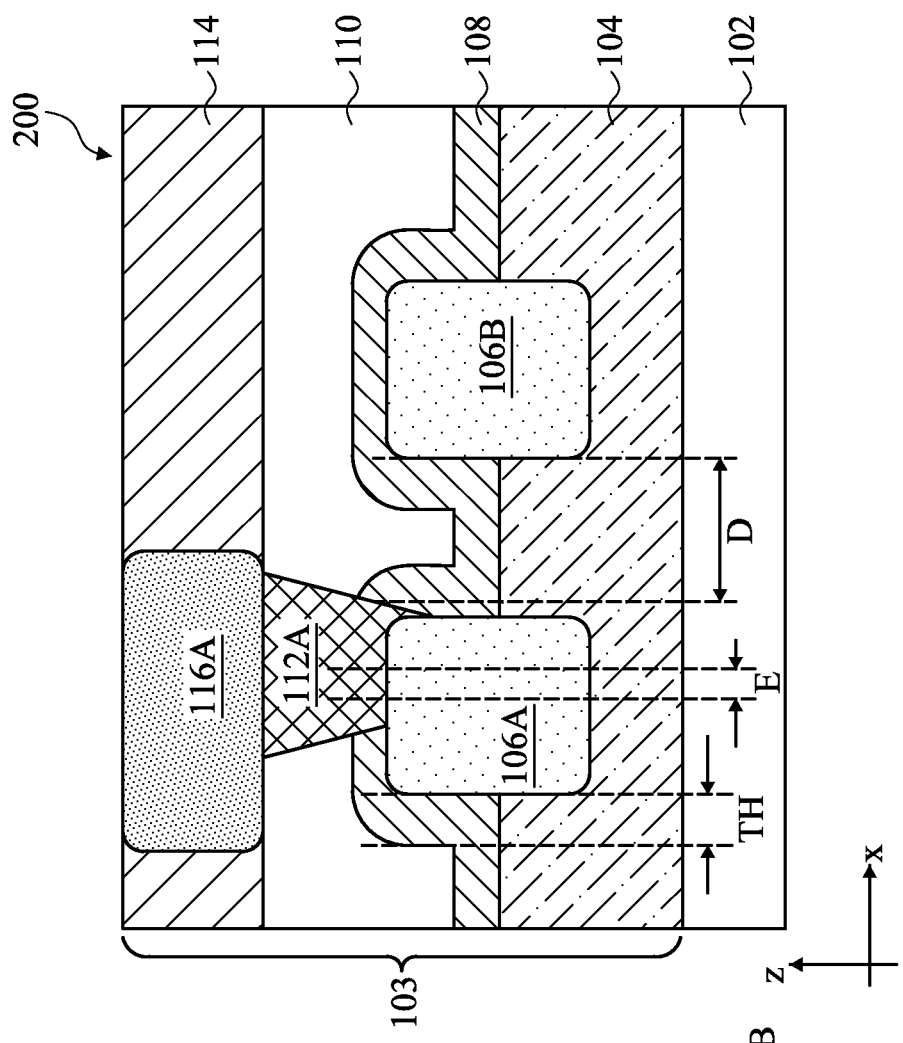
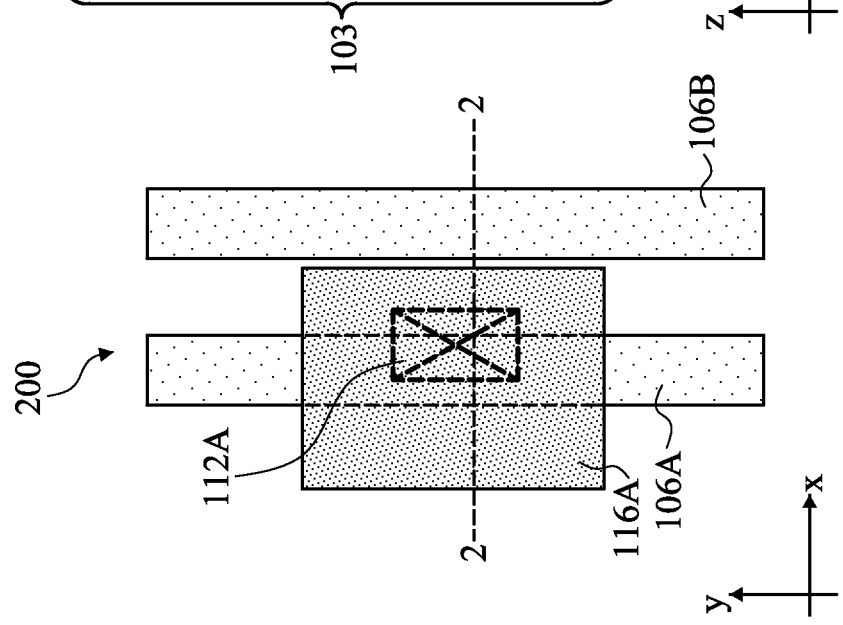
Fig. 2B
Fig. 2A

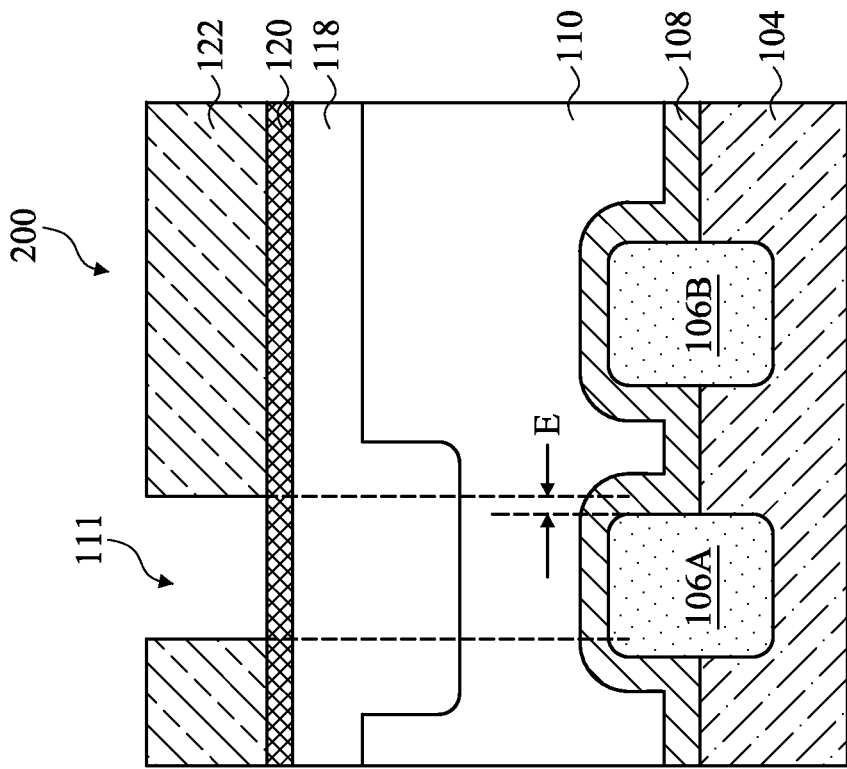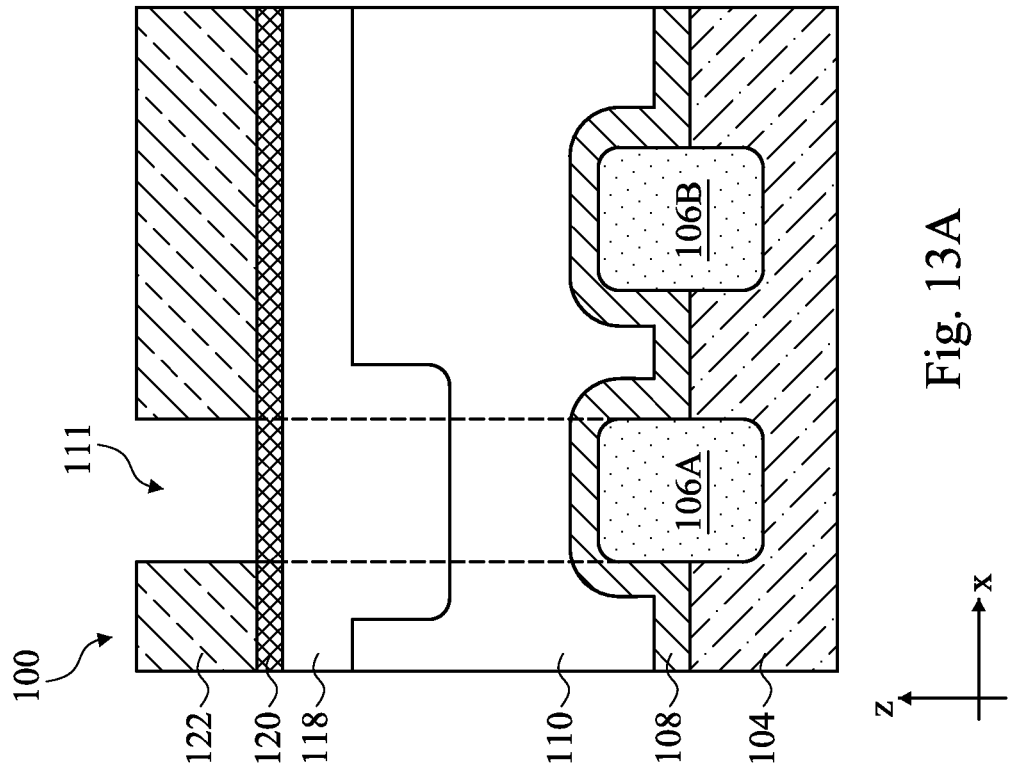
Fig. 13B
Fig. 13A

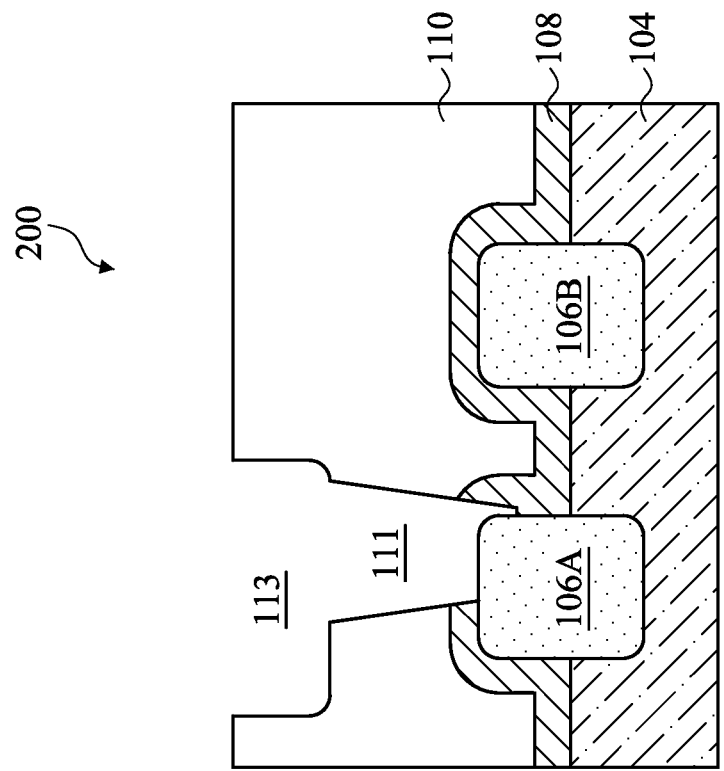
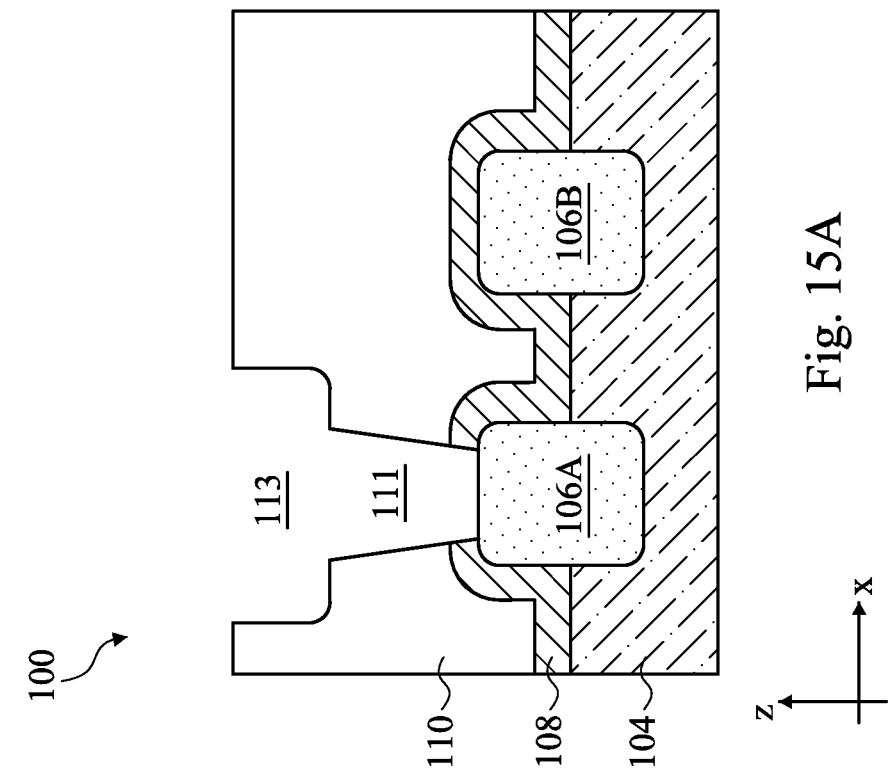

INTERCONNECT STRUCTURE HAVING AN ETCH STOP LAYER OVER CONDUCTIVE LINES

PRIORITY DATA

The present application is a continuation of U.S. patent application Ser. No. 14/751,543, filed Jun. 26, 2015, to Cheng-Hsiung Tsai, et al., titled "Interconnect Structure Having an Etch Stop Layer over Conductive Lines", which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, multilayer interconnects are used to connect various devices (transistors, resistors, capacitors, etc.) to form an IC. In a typical multilayer interconnect structure, conductive lines (e.g., copper wires) are laid in stacked dielectric layers and are connected through vias from one layer to another layer. Copper wires and vias are typically fabricated using single or dual damascene processes. In such processes, an underlying dielectric layer is patterned to form trenches, then the trenches are overfilled with copper, and chemical-mechanical planarization (CMP) is used to remove excessive copper, thereby forming copper wires in the trenches. Subsequently, another dielectric layer is formed over the underlying dielectric layer and the above process is repeated to form vias and upper level copper wires. The multiple dielectric layers are patterned with lithography (or photolithography) processes. Sometimes, overlay errors between lithography processes may result in via misalignment with respect to the target copper wire. A misaligned via may cause accidental bridge (shorting) with a nearby copper wire, creating IC defects; or cause excessive etching of the underlying dielectric layer, creating IC reliability issues. Such via-wire misalignment issues become more problematic as the IC miniaturization continues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A and 1B are top and cross-sectional views of a multilayer interconnect of an IC, constructed according to various aspects of the present disclosure.

FIGS. 2A and 2B are top and cross-sectional views of a multilayer interconnect of an IC with a via-wire misalignment to illustrate aspects of the present disclosure.

FIGS. 12A, 12B, 13A, 13B, 14A, 14B, 15A, 15B, 16A, and 16B are cross-sectional views of forming a multilayer interconnect for an IC according to the method of FIG. 11, in accordance with some embodiments.

DETAILED DESCRIPTION

Figure 3:
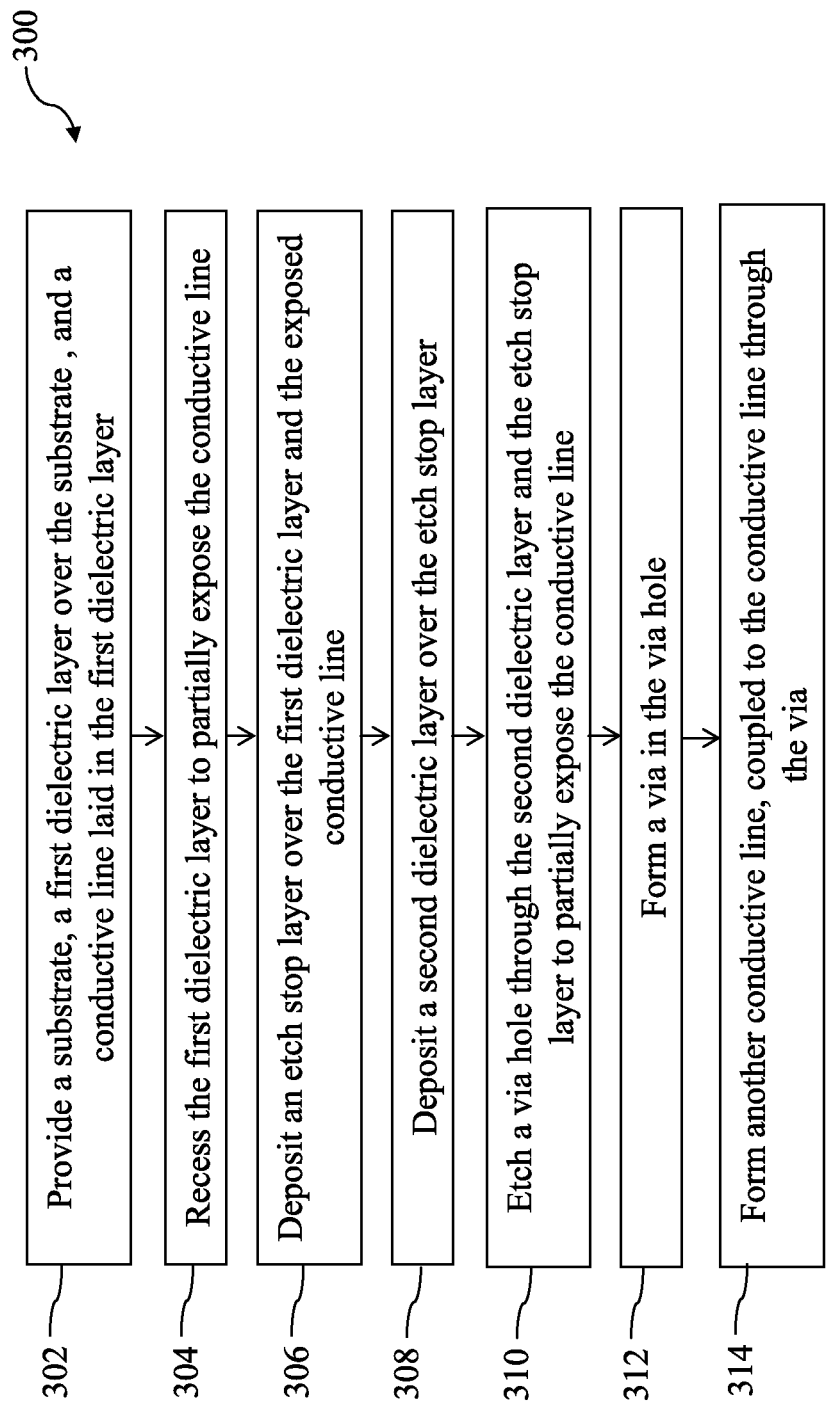
FIG. 3 shows a flow chart of a method of fabricating an IC with a multilayer interconnect of FIGS. 1A and 1B, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices. More particularly, it is related to multilayer interconnect structures for integrated circuits (IC). An object of the present disclosure is to provide a protecting layer over conductive lines in a multilayer interconnect. In case of via-wire misalignment due to lithography overlay errors when forming via holes, the protecting layer minimizes lateral and vertical over-etching of the underlying dielectric layer. This effectively prevents accidental shorting of the vias with a nearby wire. It also improves device reliability by limiting electron migration (EM) and time-dependent dielectric breakdown (TDDB) associated with metal diffusion into the underlying dielectric layer.

FIG. 1A shows a top view of a semiconductor device 100, and FIG. 1B shows a cross-sectional view of the semiconductor device 100 along the "1-1" line of FIG. 1A. Referring to FIGS. 1A and 1B, the semiconductor device 100 includes a substrate 102 and a multilayer interconnect structure 103, constructed according to the present disclosure. For the purpose of simplicity, the interconnect structure 103 is shown to have two layers of conductive lines. The first layer includes conductive lines 106A and 106B (collectively as 106A/B), and the second layer includes a conductive line 116A. The two layers are interconnected through a via 112A. It is noted that, in various embodiments, the interconnect structure 103 may comprise more than two layers of conductive lines, such as five, seven, or even more layers in complex ICs. In addition, the interconnect structure 103 may include one or more layers of conductive lines below the 106A/B layer and/or above the 116A layer.

In embodiments, the substrate 102 includes a silicon substrate (e.g., a wafer). Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor on insulator (SOI). The substrate 102 includes active devices such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, and high frequency transistors. The transistors may be planar transistors or multi-gate transistors such as FinFETs. The substrate 102 may further include passive devices such as resistors, capacitors, and inductors.

The interconnect structure 103 is built over the substrate 102 and connects the various active and/or passive devices in the substrate 102 to form an IC. In the embodiment as shown, the interconnect structure 103 includes a first dielectric layer 104, which may comprise a low-K dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

The interconnect structure 103 further includes the conductive lines 106A and 106B, partially laid in the dielectric layer 104 and partially above the dielectric layer 104. Although not shown, the conductive lines 106A/B are coupled to the active and/or passive devices in the substrate 102 through other underlying layers of the interconnect structure 103 or through the terminals (e.g., source, drain, and gate contacts) of the active and/or passive devices. In embodiments, the conductive lines 106A and 106B each include an electrically conductive metal-diffusion barrier layer as an outer layer and a metal conductor as an inner layer. For example, the barrier layer may include tantalum (Ta) or tantalum nitride (TaN) and the metal conductor may be copper (Cu), aluminum (Al), tungsten (W), cobalt (Co), or other suitable metals. In embodiments, the barrier layer includes one or more layers of material.

The interconnect structure 103 further includes an etch stop layer 108 and a second dielectric layer 110. The etch stop layer 108 is formed over the first dielectric layer 104 and the conductive lines 106A/B, and has a conformal cross-sectional profile in the present embodiment. The dielectric layer 110 is formed over the etch stop layer 108. In various embodiments, the dielectric layer 110 includes a low-K dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materi-als. The dielectric layers 104 and 110 may include the same or different dielectric material(s). The etch stop layer 108 includes a dielectric material that has a higher density than the materials in the dielectric layers 110 and 104. For example, the etch stop layer 108 may include a material selected from the group consisting of SiCN, SiCO, $SiO_2$, SiN, and AlON. Other suitable materials for the etch stop layer 108 are within the present disclosure.

The dielectric layer 110 and the etch stop layer 108 collectively provide an opening within which the via 112A is located. The interconnect structure 103 further includes a third dielectric layer 114 where the conductive line 116A is laid. In embodiments, the dielectric layers 114 and 110 may include the same or different materials. The via 112A and the conductive lines 116A each include an electrically conductive metal-diffusion barrier layer surrounding a metal conductor as discussed with respect to the conductive lines 106A/B, though different materials may be used.

In embodiments, the conductive lines 106A/B and the via 112A are formed in separate damascene processes, each of which includes lithographic patterning of the respective dielectric layers 104 and 110. As a result, lithography overlay errors between the via 112A and the conductive line 106A must be taken into account during the fabrication of the device 100.

As shown in FIGS. 1A and 1B, the via 112A is properly aligned with the conductive line 106A, i.e., it is located on top of the conductive line 106A with their center lines overlapped from the top view. This is an ideal case for the fabrication. However, as it is practically impossible to eliminate the lithography overlay errors, misalignment between a via and an underlying conductive line does occur in some ICs or in some portions of an IC. This is illustrated in FIGS. 2A and 2B, where FIG. 2A is a top view of a device 200 and FIG. 2B is a cross-sectional view of the semiconductor device 200 along the "2-2" line of FIG. 2A. The device 200 is similar to the device 100 in many respects. However, during the fabrication of the device 200, an overlay error E occurs between the via 112A and the conductive line 106A, which is defined as a misalignment between their respective center lines. The overlay error E may be caused by variations in lithography and etching processes, such as lithography light source, resist material, resist developing process, etching process, etc. The overlay error E may be within the process variation window, but may cause quality and/or reliability issues for the device 200 if not properly dealt with. In traditional multilayer interconnect structures, the etch stop layer 108 is not present. Instead, the conductive lines 106A and 106B would be fully buried in the dielectric layer 104. A misaligned via hole over the conductive line 106A would cause excessive etching of the underlying dielectric layer 104 whose etching rate is typically high (easy to be etched). Consequently, the lateral distance D between the via 112A and the nearby conductive line (e.g., the conductive line 106B) would become very small, causing bridging there between.

In the present embodiment, the thickness TH of the etch stop layer 108 is formed to be greater than the overlay error E. This effectively limits the etching of the via hole to be within the sidewalls of the etch stop layer 108. Further, the etch stop layer 108 has a slower etching rate than the dielectric layers 110 and 104. For example, the etching of the etch stop layer 108 may be three times slower than that of the dielectric layers 110 and 104 during the via hole etching process. This effectively limits the lateral and vertical etching of the dielectric layers 110 and 104 when the via hole is indeed misaligned with the conductive line 106A, such as shown in FIG. 2B. As a result, the lateral distance D between the via 112A and the neighboring conductive line 106B is advantageously greater in the present embodiment than in traditional interconnect structure for the same amount of overlay errors. In addition, the etch stop layer 108 acts as an additional diffusion barrier layer over the metal materials in the conductive lines 106A/B, which improves the device reliability by reducing electron migration (EM) and time-dependent dielectric breakdown (TDDB). The method of fabricating the interconnect structure 103 will be described below.

FIG. 3 illustrates a flow chart of a method 300 of forming a semiconductor device having a multilayer interconnect structure, such as the semiconductor device 100 having the multilayer interconnect structure 103, according to various aspects of the present disclosure. The method 300 is merely an example, and is not intended to limit the present disclosure beyond what is explicitly recited in the claims. Additional operations can be provided before, during, and after the method 300, and some operations described can be replaced, eliminated, or moved around for additional embodiments of the method. The method 300 is described below in conjunction with FIGS. 4-12 which are cross-sectional views of the semiconductor device 100 in various stages of a manufacturing process.

Figure 4:
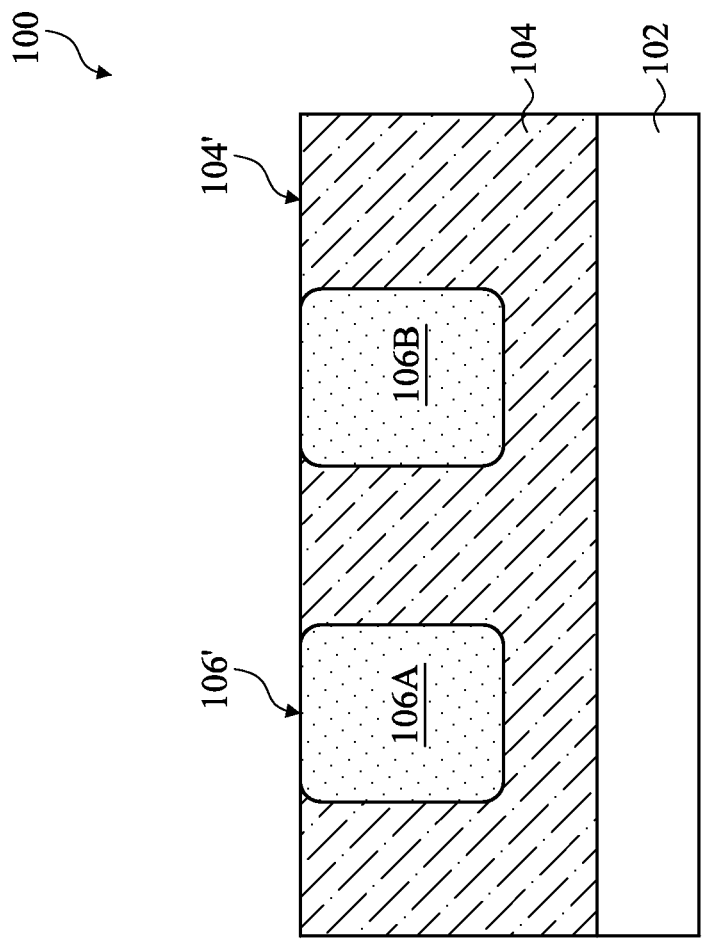
FIGS. 4, 5, 6, 7, 8, 8A, 9, and 10 are cross-sectional views of forming a multilayer interconnect for an IC according to the method of FIG. 3, in accordance with some embodiments.

At operation 302, the method 300 (FIG. 3) receives a device 100 as shown in FIG. 4. The device 100 (FIG. 4) includes a substrate 102, a dielectric layer 104, and conductive lines 106A/B buried in the dielectric layer 104. The composition of the substrate 102, the dielectric layer 104, and the conductive lines 106A/B have been discussed with respect to FIGS. 1A and 1B above. The dielectric layer 104 and the conductive lines 106A/B may be formed over the substrate 102 by a variety of processes including deposition, lithography, etching, and CMP processes, as illustrated below.

In an embodiment, the dielectric layer 104 includes a low-K dielectric material and is deposited over the substrate 102 by a chemical vapor deposition (CVD) technique such as low-pressure CVD (LPCVD), plasma-enhanced CVD (PECVD), flowable CVD (FCVD), or other suitable deposition techniques. For example, the FCVD process includes depositing a flowable material (such as a liquid compound) over the substrate 102 to fill various trenches thereon, and converting the flowable material to a solid material by a suitable technique, such as thermal annealing or ultra-violet radiation. The dielectric layer 104 is then planarized by a CMP process or otherwise recessed to have a planar top surface.

Subsequently, the dielectric layer 104 is patterned with one or more lithography and etching processes to form trenches therein. The lithography process may include forming a photoresist (or resist) layer overlying the dielectric layer 104, exposing the resist to a pattern, performing post-exposure bake processes, and developing the resist to form a masking element including the resist. The masking element is then used for etching trenches into the dielectric layer 104. The etching process may include dry etching, wet etching, and/or other suitable processes.

Thereafter, an electrically conductive barrier/adhesion layer and a metal (e.g., copper) conductor layer are deposited on the patterned dielectric layer 104 by one or more of the techniques such as sputtering, CVD, and electrolytic or electroless plating. The barrier layer and the metal conductor layer overfill the trenches in the dielectric layer 104. Thereafter, a CMP process is performed to planarize the top surface of the device 100 to remove excessive barrier and metal materials over the dielectric layer 104. The barrier and metal materials in the trenches remain, forming the conductive lines 106A/B. As a result of the CMP process, the top surface 104' of the dielectric layer 104 and the top surface 106' of the conductive lines 106A/B become coplanar.

Figure 5:
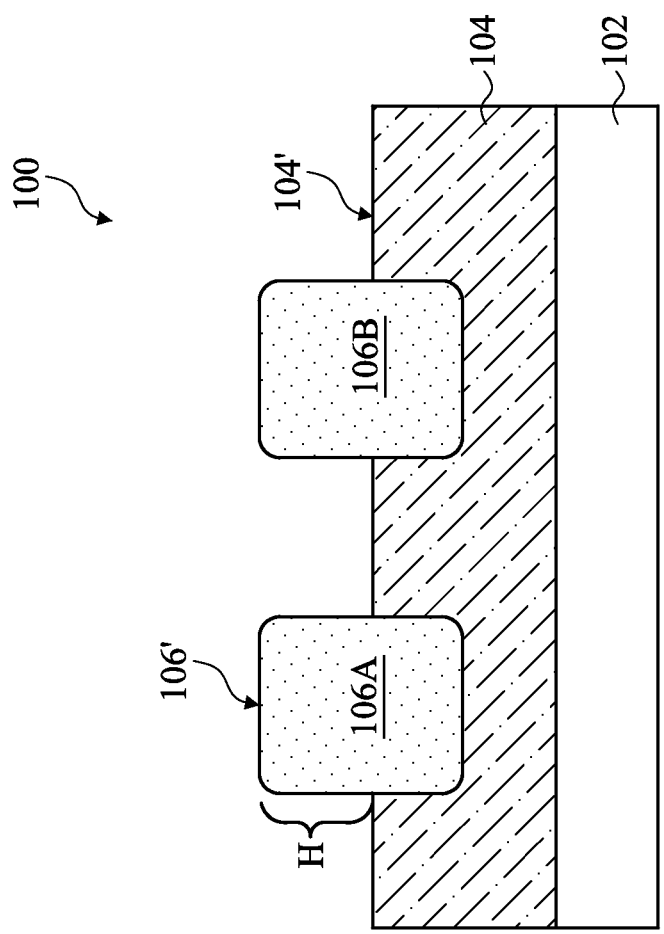

At operation 304, the method 300 (FIG. 3) recesses the dielectric layer 104 to partially expose the conductive lines 106A/B. Referring to FIG. 5, the dielectric layer 104 is recessed and a first portion of the conductive lines 106A/B is exposed to have a height H above the top surface 104' in the "z" direction. The remaining portion of the conductive lines 106A/B is still buried in the dielectric layer 104. In an embodiment, the conductive lines 106A/B include copper and operation 304 includes a reactive ion etching (RIE) process tuned for recessing the dielectric layer 104. The conductive lines 106A/B remain substantially unchanged in the RIE process. However, the edges of the conductive lines 106A/B between the top and sidewall surfaces thereof do become rounded during the etching process. The height H is one of the factors that determine how much vertical protection the etch stop layer 108 (FIG. 2B) will provide. If the height H is too small, a misaligned via hole may penetrate the etch stop layer 108 and reach into the dielectric layer 104. A desirable height H can be obtained by controlling the etching time and the etching rate of the dielectric layer 104 in the RIE process. In an embodiment, the height H is controlled to be in the range of about 1 nanometer (nm) to about 7 nm.

Figure 6:
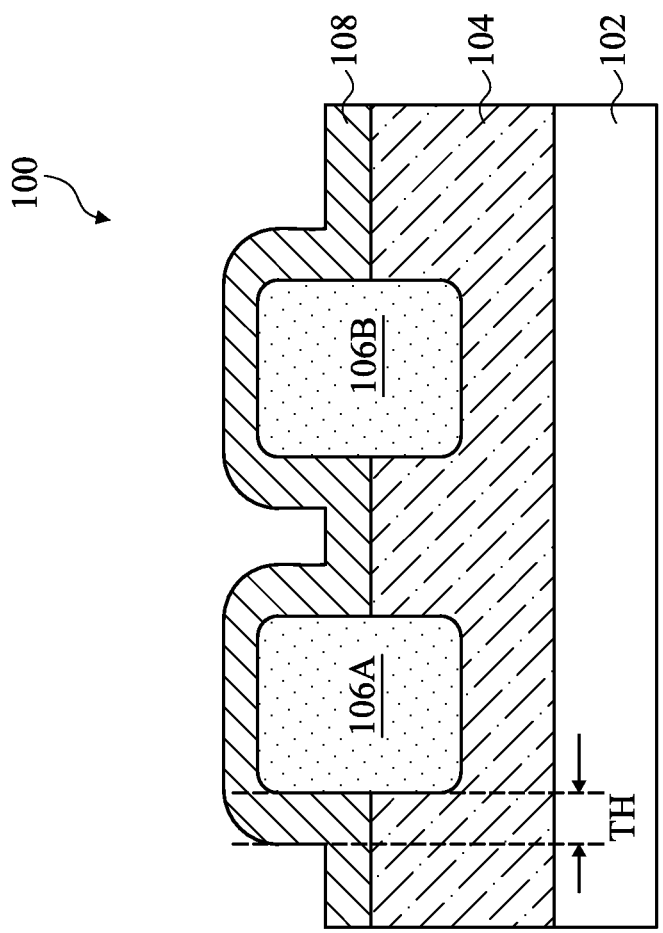

At operation 306, the method 300 (FIG. 3) deposits an etch stop layer 108 over the dielectric layer 104 and the exposed conductive lines 106A/B. Referring to FIG. 6, in the present embodiment, the etch stop layer 108 is deposited to have a conformal cross-sectional profile in the "x-z" plane and covers both the top and sidewall surfaces of the conductive lines 106A/B. In the present embodiment, the rounded edges of the conductive lines 106A/B facilitate the conformal deposition of the etch stop layer 108. In an embodiment, the etch stop layer 108 is deposited using an atomic layer deposition (ALD) technique. Further, the etch stop layer 108 is deposited to have a sidewall thickness TH. The sidewall thickness TH is controlled to be greater than a maximum lithography overlay error allowed by the fabrication process. This effectively prevents misaligned via holes from excessive lateral etching (in the "x" direction). In an example, the thickness TH ranges from about 1 nm to about 7 nm. In an alternative embodiment, the etch stop layer 108 does not have a conformal cross-sectional profile in the "x-z" plane, but its sidewall thickness TH is still formed to be greater than a maximum lithography overlay error allowed by the fabrication process. In various embodiments, the etch stop layer 108 includes a material that has a higher density than the dielectric layer 104. In one example, the dielectric layer 104 includes a porous carbon-doped silicon dioxide and the etch stop layer 108 includes un-doped silicon dioxide. In various embodiments, the etch stop layer 108 may include a material such as SiCN, SiCO, SiO2, SiN, and AlON.

Figure 7:
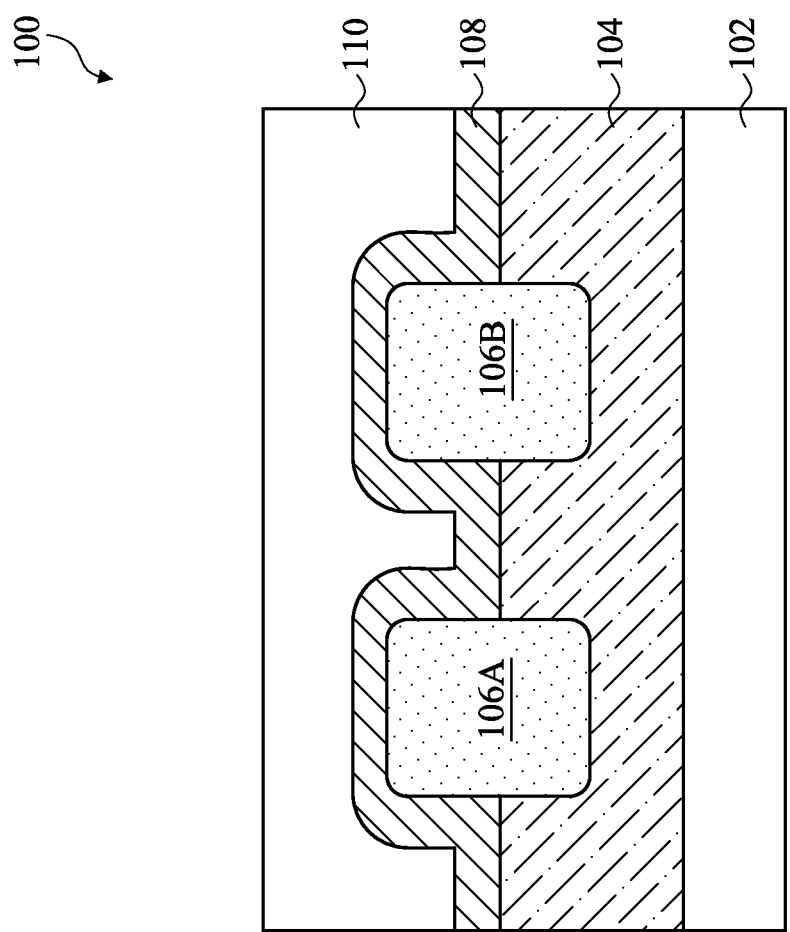

At operation 308, the method 300 (FIG. 3) deposits a second dielectric layer 110 over the etch stop layer 108. Referring to FIG. 7, the dielectric layer 110 may use the same material as the dielectric layer 104. Alternatively, the dielectric layer 110 may use a different low-K material. In various embodiments, the dielectric layer 110 includes a dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 110 may be formed using chemical vapor deposition (CVD) such as LPCVD, PECVD, and FCVD. The top surface of the dielectric layer 110 is planarized.

At operation 310, the method 300 (FIG. 3) etches a via hole 111 through at least the dielectric layer 110 and the etch stop layer 108 to partially expose the conductive line 106A. In embodiments, the via hole 111 may be etched as part of a single damascene process (illustrated in FIGS. 8-10) or a dual damascene process (illustrated in FIGS. 11-16B), which are described separately below.

Figure 8:
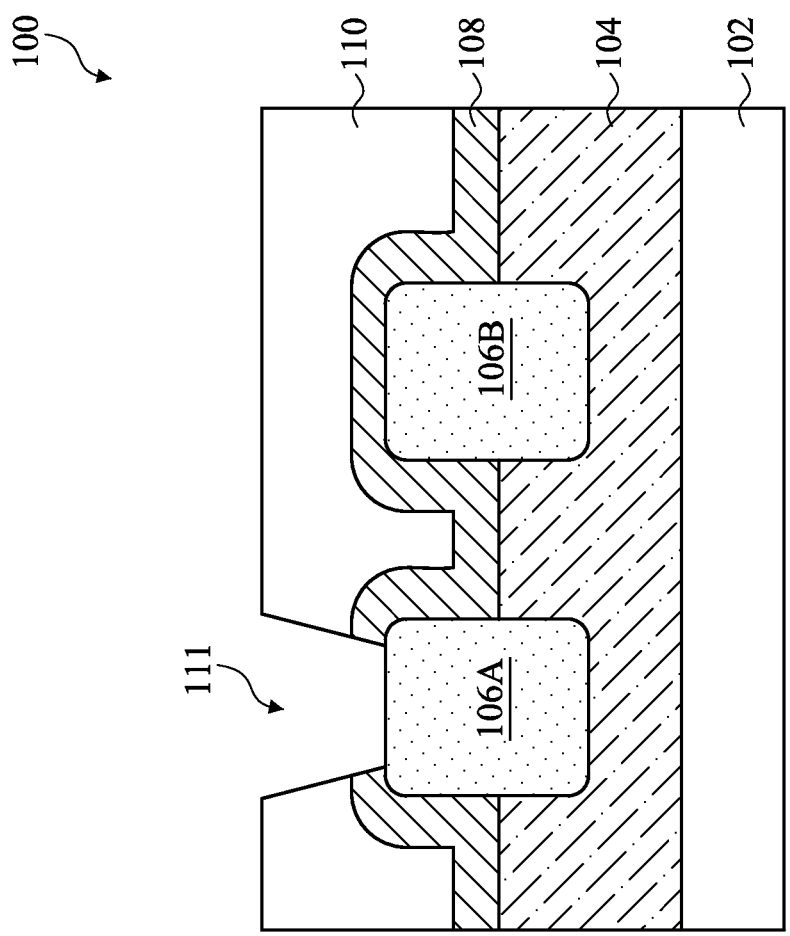

Referring to FIG. 8, shown therein is the device 100 having the via hole 111 etched through the dielectric layer 110 and the etch stop layer 108. The via hole 111 exposes a portion of the top surface of the conductive line 106A, but does not expose the sidewall surfaces of the conductive line 106A. In the present embodiment, the via hole 111 is formed by one or more lithography and etching processes. The lithography process may include forming a resist layer overlying the dielectric layer 110, exposing the resist to a pattern, performing post-exposure bake processes, and developing the resist to form a masking element including the resist. The masking element is then used for etching trenches into the dielectric layer 110 and the etch stop layer 108 until the conductive line 106 is exposed. The etching process may include dry etching, wet etching, and/or other suitable processes.

Figure 8A:
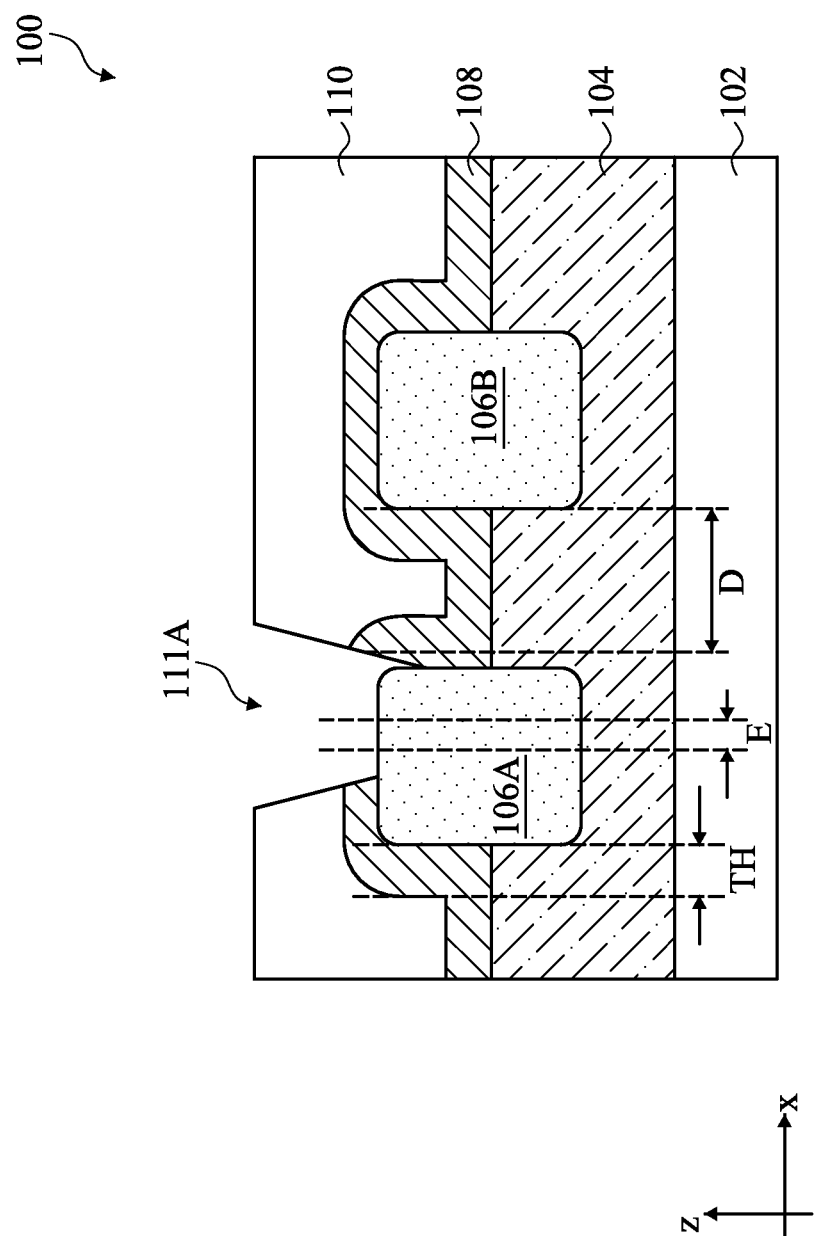

In embodiments, the lithography process for patterning the dielectric layer 104 and the lithography process for patterning the dielectric layer 110 use two separate masks (or photomasks). The conductive line 106A is represented as a trench in one mask used by the former process and the via hole 111 is represented as another trench in another mask used by the latter process. Due to process variations, certain misalignment (or overlay error) may exist between the via hole 111 and the conductive line 106A. As shown in FIG. 8A, a via hole 111A is not properly aligned with the conductive line 106A due to an overlay error E. As a result, not only does the via hole 111A expose the top surface of the conductive line 106A, it also exposes a portion of the sidewall surface of the conductive line 106A. Without the etch stop layer 108, such misalignment would create at least two adverse effects. One adverse effect is that the etching process would excessively etch the dielectric layer 110 laterally (along the "x" direction) due to its high etching rate. This would undesirably reduce the distance D between the to-be-formed via and the neighboring conductive line 106B, causing bridging defects (electrical short). Another adverse effect is that the etching process would excessively etch the dielectric layer 104 vertically (along the "z" direction) due to its high etching rate. This might cause metal diffusion into the dielectric layer 104, a long-term reliability issue for the IC. In the present embodiment, the etch stop layer 108 has a lower etching rate than the dielectric layers 110 and 104, which reduces the lateral and vertical etching of the via hole 111A. Further, the sidewall thickness TH of the etch stop layer 108 is formed to be greater than the overlay error E. This ensures that the bottom portion of the via hole 111A is confined within the etch stop layer 108 and the conductive line 106A. Still further, the etch stop layer 108 over the conductive lines 106A/B acts as an additional protection against bridging, EM, and TDDB defects. In summary, the presence of the etch stop layer 108 prevents defects and reliability issues associated with certain amount of overlay errors between a via and the underlying conductive line. This is one of the advantages provided by the present disclosure over existing multilayer interconnect structures.

Figure 9:
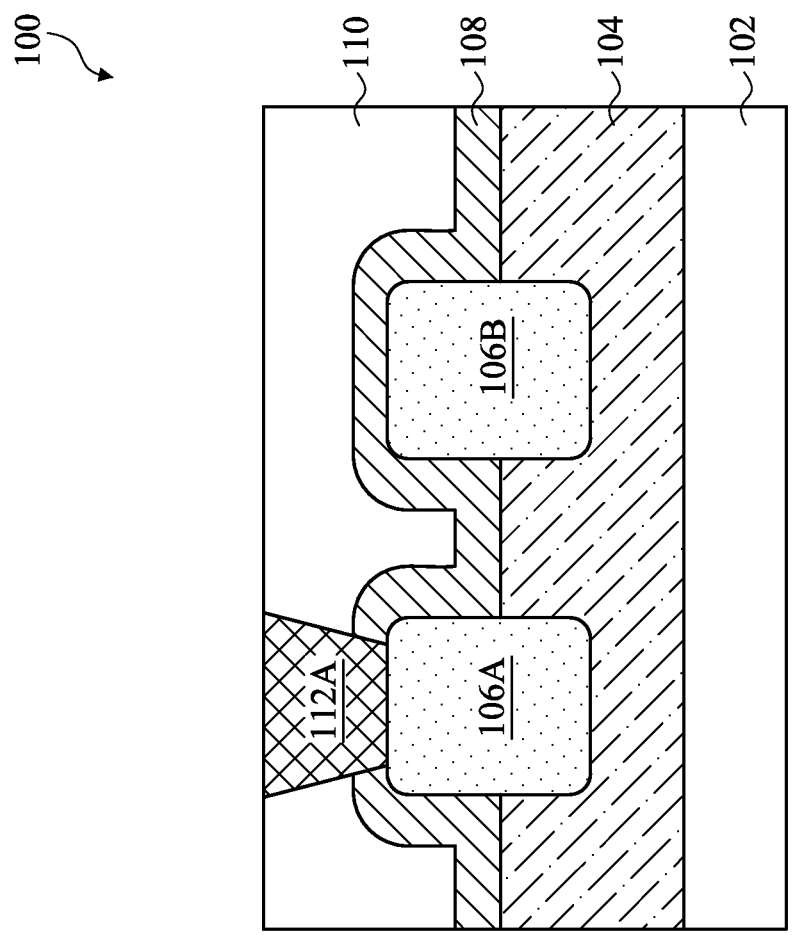

At operation 312, the method 300 (FIG. 3) forms a via 112A in the via hole 111 of FIG. 8. Referring to FIG. 9, the via 112A includes one or more barrier layers and a metal conductor layer. In one example, the barrier layer(s) may include tantalum (Ta) or tantalum nitride (TaN) and the metal conductor may include copper (Cu), aluminum (Al), tungsten (W), cobalt (Co), or other suitable metals. The barrier layers may be formed by CVD, physical vapor deposition (PVD), or ALD techniques and the metal conductor may be formed by sputtering, CVD, or electroplating techniques. The barrier layer and the metal conductor overfill the via hole 111 using the above deposition methods. Subsequently, a CMP process is performed to remove excessive material over the top surface of the dielectric layer 110, leaving the remaining barrier layer and metal conductor as the via 112A.

Figure 10:
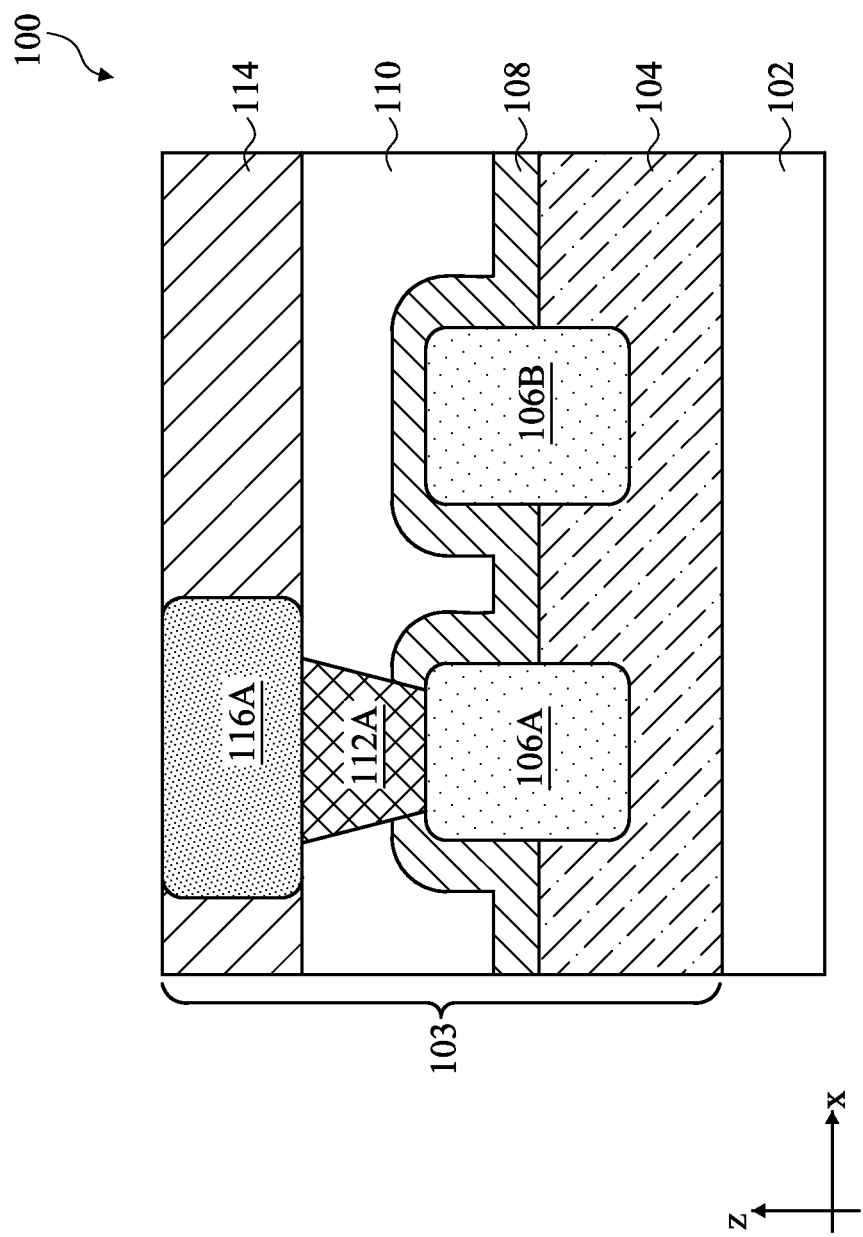

At operation 314, the method 300 (FIG. 3) forms another conductive line, the conductive line 116A, coupled to the conductive line 106A through the via 112A. Referring to FIG. 10, a dielectric layer 114 is formed over the dielectric layer 110 and the conductive line 116A is laid in the dielectric layer 114 and electrically coupled to the conductive line 106A through the via 112A. The dielectric layer 114 may include the same or different dielectric material than the dielectric layers 110 and 104. The composition of the conductive line 116A is substantially the same as the conductive line 106A in various embodiments. In an embodiment, operation 314 includes depositing a low-K dielectric layer 114 over the dielectric layer 110, etching the dielectric layer 114 to form trenches therein, overfill the trenches with electrically conductive barrier/adhesion layer and a metal conductor, and planarize a top surface of the device 100 to remove excessive barrier layer and metal conductor. The method 300 may proceed to further steps to complete the fabrication of the device 100, for example, by manufacturing additional conductive layers of the interconnect structure 103.

Figure 11:
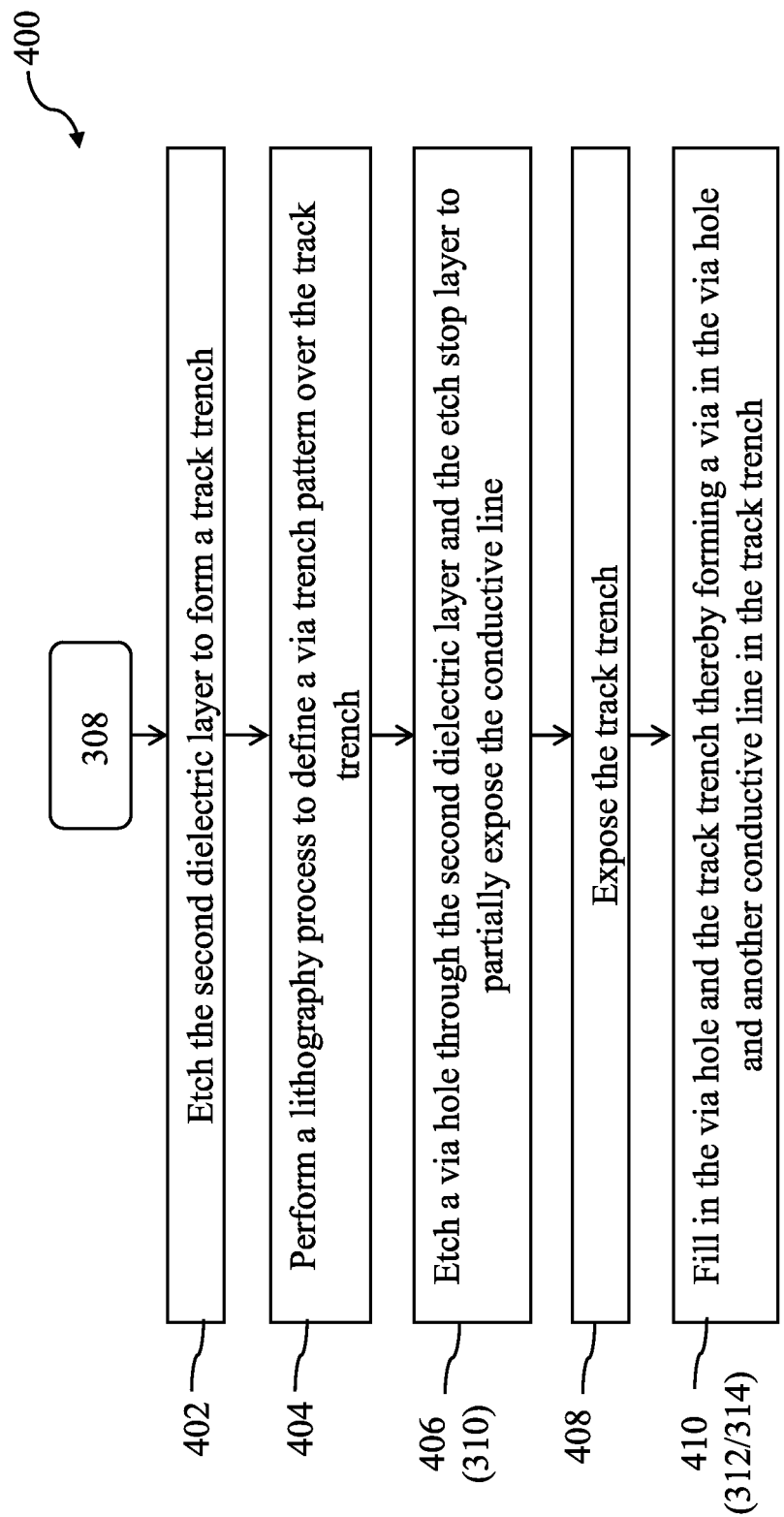
FIG. 11 shows a flow chart of another method of fabricating an IC with a multilayer interconnect, according to some embodiments.

FIGS. 11-16B illustrate the formation of the via 112A and the conductive line 116A using a dual damascene process. Referring to FIG. 11, shown therein is a method 400 of forming a semiconductor device having a multilayer interconnect structure, such as the semiconductor device 100 having the multilayer interconnect structure 103, according to various aspects of the present disclosure. The method 400 may be viewed as an embodiment of the method 300 (FIG. 3), where it proceeds from operation 308 and forms the via 112A and the conductive line 116A in a dual damascene process. The method 400 is briefly described below in conjunction with FIGS. 12A-16B. In particular, FIGS. 12A, 13A, 14A, 15A, and 16A illustrate cross-sectional views of the semiconductor device 100 during various fabrication stages, while FIGS. 12B, 13B, 14B, 15B, and 16B illustrate cross-sectional views of the semiconductor device 200 during the respective fabrication stages. The devices 100 and 200 may be different portions of the same IC or may be portions of different ICs. They are placed side-by-side for illustrative purposes.

Figure 12A:
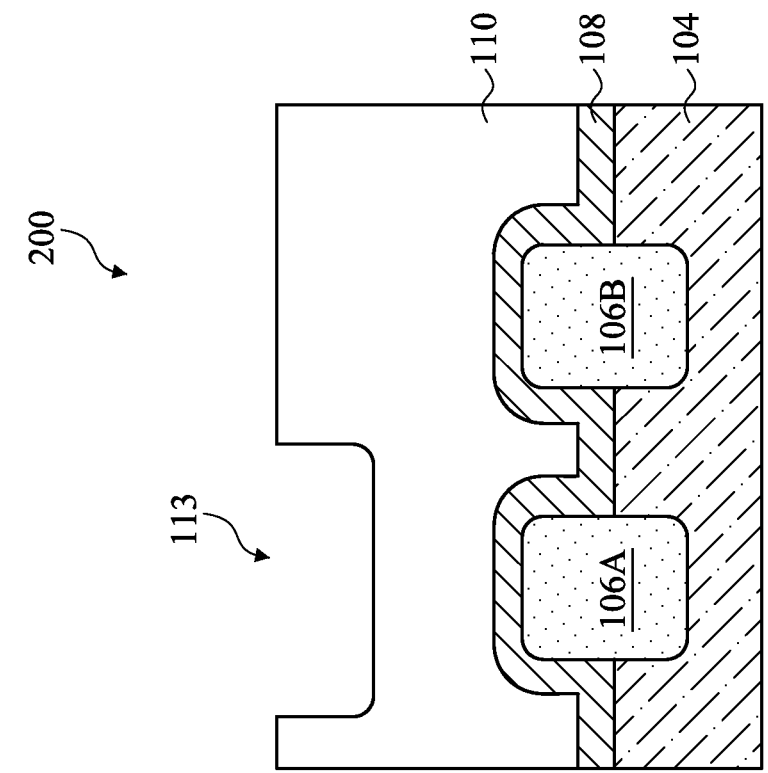
Figure 12B:
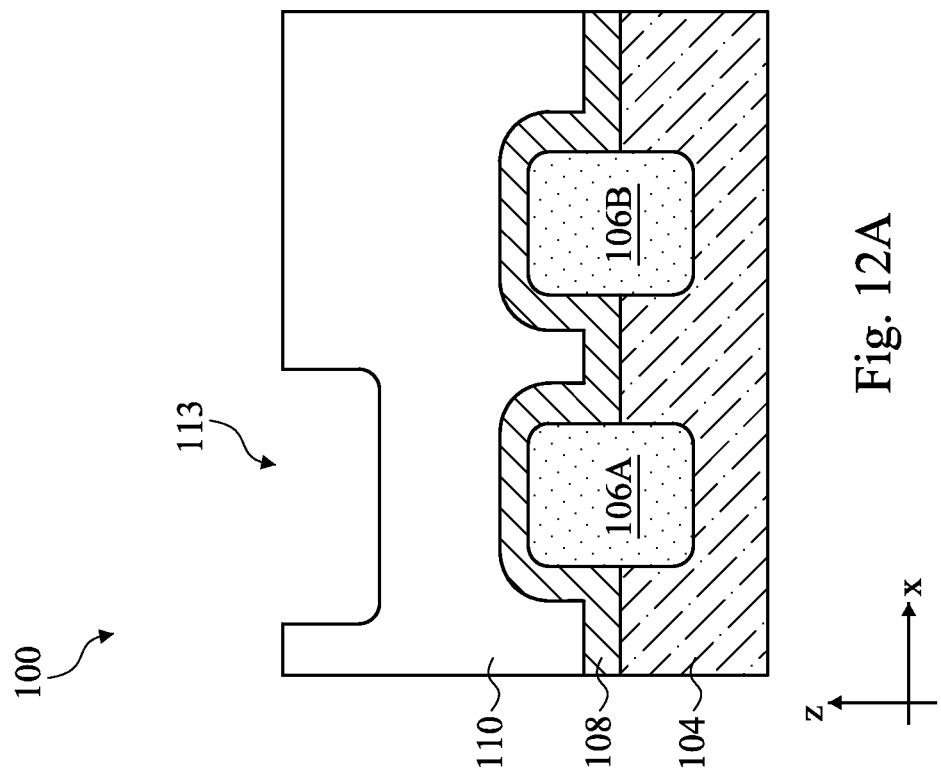

At operation 402, the method 400 etches a track trench 113 in the second dielectric layer 110. Referring to FIGS. 12A and 12B, the track trench 113 is a placeholder for the conductive line 116A.

At operation 404, the method 400 performs a lithography process to define a via trench 111 over the track trench 113. Referring to FIGS. 13A and 13B, illustrated therein is an exemplary lithography process using three layers of material (tri-layer lithography). The three layers are: bottom layer (BL) 118, middle layer (ML) 120, and resist 122. The BL 118 fills the track trench 113 (FIG. 12A/B), the ML 120 is formed over the BL 118, and the resist 122 is formed over the ML 120 and is further patterned by a photolithography process to provide the via trench 111 therein. As shown in FIG. 13A, the via trench 111 is properly aligned with the conductive line 106A in the fabrication of the device 100. As shown in FIG. 13B, the via trench 111 is misaligned with the conductive line 106A in the fabrication of the device 200 due to a lithography overlay error E.

Figure 14B:
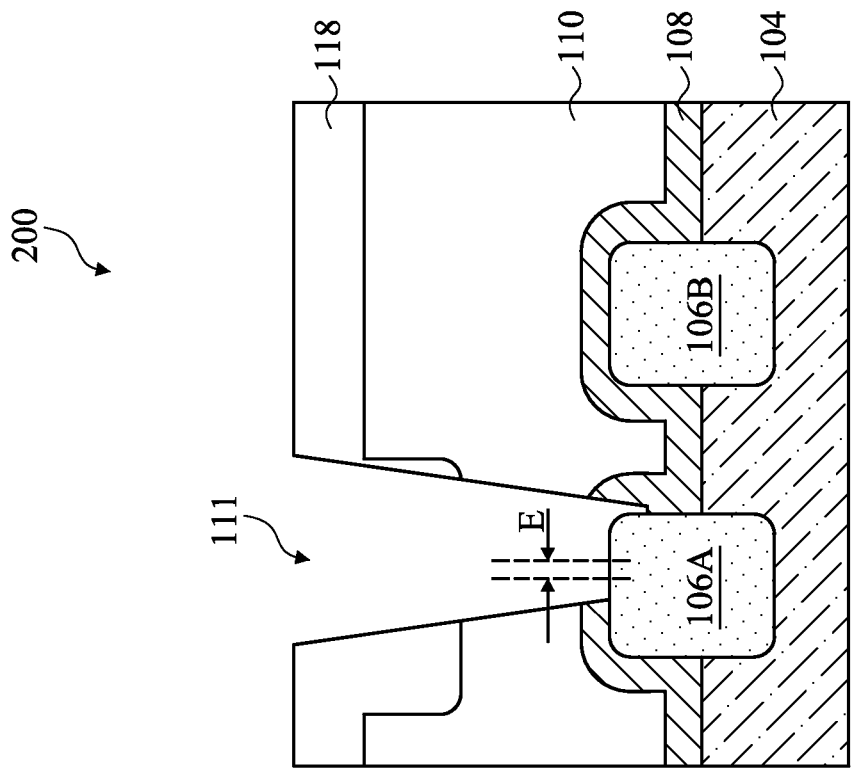
Figure 14A:
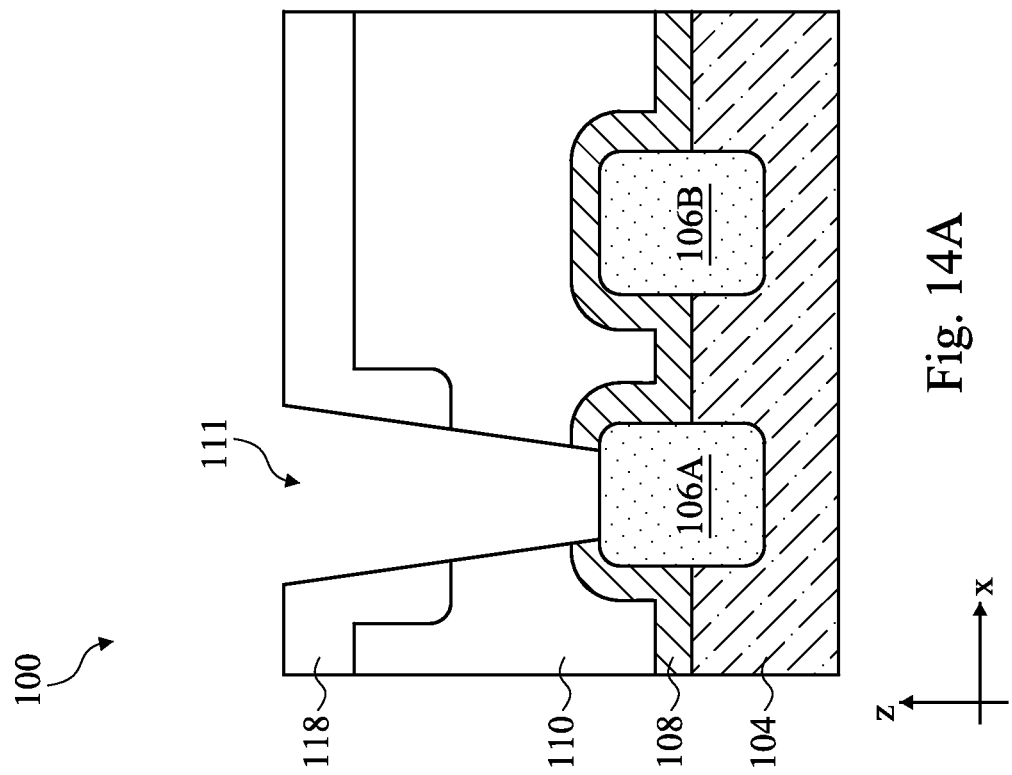

At operation 406, which is an embodiment of operation 310, the method 400 performs one or more etching processes to extend the via trench 111 to the various underlying layers. Referring to FIGS. 14A and 14B, the BL 118, the second dielectric layer 110, and the etch stop layer 108 are etched to partially expose the conductive line 106A. The resist 122 and the ML 120 of FIGS. 13A and 13B have been removed.

At operation 408, the method 400 removes the BL 118 to expose the track trench 113. Referring to FIGS. 15A and 15B, the track trench 113 and the via hole 111 are formed and the conductive line 106A is partially exposed in each of the devices 100 and 200. In the device 100, the via hole 111 is properly aligned with the conductive line 106A and only a portion of the top surface of the conductive line 106A is exposed. In the device 200, the via hole 111 is misaligned with the conductive line 106A and, as a result, a portion of the top surface and a portion of the sidewall surface of the conductive line 106A are exposed. Due to the presence of the etch stop layer 108, the bottom portion of the via hole 111A is advantageously confined within the etch stop layer 108 and the conductive line 106A.

Figure 16A:
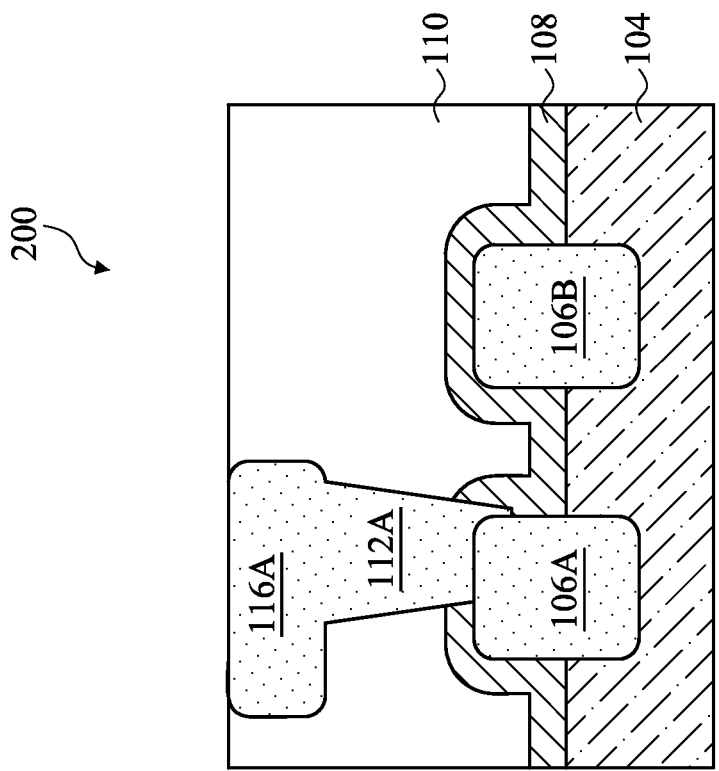
Figure 16B:
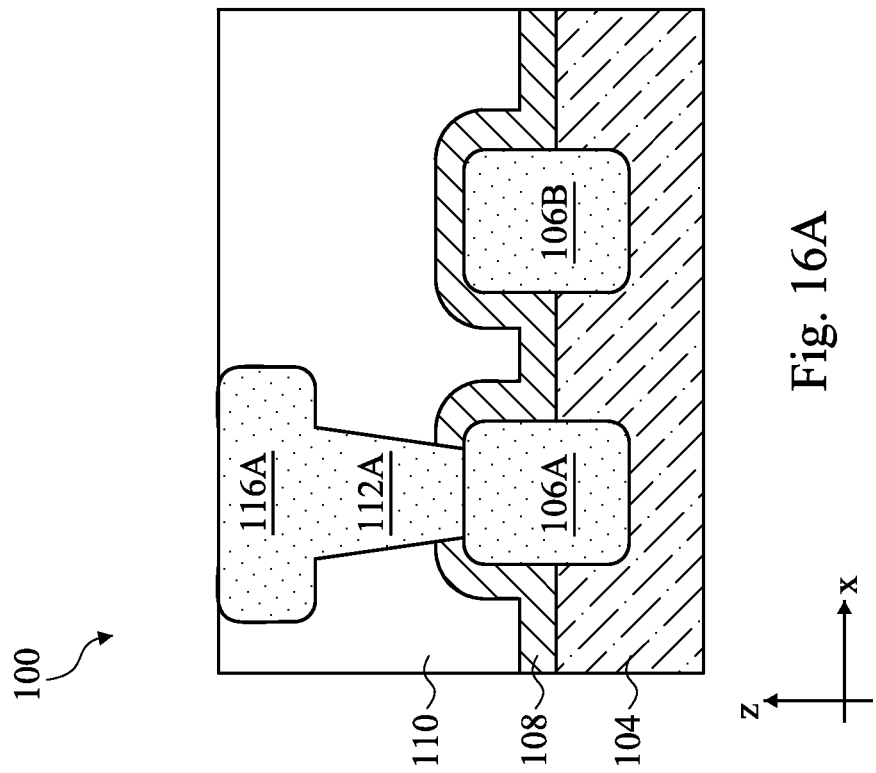

At operation 410, the method 400 fills the via hole 111 and the track trench 113 with suitable material(s) to form the via 112A and the conductive line 116A as shown in FIGS. 16A and 16B. A CMP process is subsequently performed to remove the excessive material(s) and to planarize the top surface of the devices 100 and 200. The operation 410 may be viewed as a combination of the operations 312 and 314.

The method 400 may proceed to further steps to complete the fabrication of the devices 100 and 200, for example, by manufacturing additional conductive layers of the interconnect structure 103.

Although not intended to be limiting, one or more embodiments of the present disclosure provide many benefits to a semiconductor device and the formation thereof. For example, embodiments of the present disclosure provide an etch stop layer as a protection layer over conductive lines in a multilayer interconnect structure. The etch stop layer limits adverse lateral and vertical etching of the underlying dielectric layer when there are via-wire misalignments due to overlay errors. In an embodiment, the sidewall thickness of the etch stop layer is formed to be greater than a maximum overlay error allowed by the fabrication process. This effectively eliminates bridging defects and EM/TDDB issues associated with the via-wire misalignment.

In one exemplary aspect, the present disclosure is directed to a device. The device includes a substrate, a first dielectric layer over the substrate, and a conductive line partially buried in the first dielectric layer. A first portion of the conductive line is laid in the first dielectric layer and a second portion of the conductive line is disposed over the first dielectric layer. The device further includes an etch stop layer over both the first dielectric layer and the conductive line. The device further includes a second dielectric layer over the etch stop layer. The etch stop layer includes a dielectric material different from materials of the first and second dielectric layers. The second dielectric layer and the etch stop layer provide an opening that partially exposes the conductive line. The device further includes a via disposed in the opening and coupled to the conductive line.

In another exemplary aspect, the present disclosure is directed to a method for manufacturing a multilayer interconnect structure for integrated circuits. The method includes providing a device that includes a substrate, a first dielectric layer over the substrate, and a conductive line laid in the first dielectric layer, wherein a top surface of the conductive line and a top surface of the first dielectric layer are coplanar. The method further includes recessing the top surface of the first dielectric layer such that a first portion of the conductive line is over the first dielectric layer. The method further includes depositing an etch stop layer over both the first dielectric layer and the first portion of the conductive line. The method further includes depositing a second dielectric layer over the etch stop layer. The method further includes performing an etching process to the second dielectric layer and the etch stop layer to form a via hole that partially exposes the conductive line, wherein an etching rate of the etch stop layer in the etching process is slower than an etching rate of the second dielectric layer in the etching process. The method further includes forming a via in the via hole.

In another exemplary aspect, the present disclosure is directed to a method for manufacturing a multilayer interconnect structure for integrated circuits. The method includes providing a device that includes a substrate, a first dielectric layer over the substrate, and a conductive line laid in the first dielectric layer, wherein a top surface of the conductive line and a top surface of the first dielectric layer are coplanar. The method further includes recessing the top surface of the first dielectric layer such that a first portion of the conductive line is exposed above the top surface of the first dielectric layer. The method further includes forming an etch stop layer over the first dielectric layer and the first portion of the conductive line, the etch stop layer having a conformal cross-sectional profile. The method further includes depositing a second dielectric layer over the etch stop layer, wherein the first and second dielectric layers are of the same material. The method further includes etching the second dielectric layer and the etch stop layer to form a via hole that partially exposes the conductive line, wherein the etch stop layer has a slower etching rate than the second dielectric layer does. The method further includes forming a via in the via hole.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a conductive feature disposed in a first dielectric layer;
   an etch stop layer disposed on the first dielectric layer and on the conductive feature, wherein a top surface of a first portion of the etch stop layer adjacent the conductive feature is at a height different from a top surface of a second portion of the etch stop layer disposed away from the conductive feature;

a second dielectric layer disposed on the etch stop layer; and a via extending through the second dielectric layer and the etch stop layer and coupled to the conductive feature, wherein:
the etch stop layer includes a vertical portion between the first portion and the second portion;
the via includes a bottom surface that extends from the conductive feature to a side surface of the via; and
an entirety of the bottom surface physically contacts the vertical portion of the etch stop layer.

2. The device of claim 1, wherein the top surface of the second portion of the etch stop layer is lower than a top surface of the conductive feature.

3. The device of claim 1, wherein the etch stop layer physically contacts the first dielectric layer and the conductive feature.

4. The device of claim 1, wherein the via physically contacts a top surface of the conductive feature and a side surface of the conductive feature.

5. The device of claim 4, wherein the etch stop layer is disposed between a portion of the via that physically contacts the side surface of the conductive feature and the second dielectric layer.

6. The device of claim 1, wherein a portion of the conductive feature extends above the first dielectric layer.

7. The device of claim 1 further comprising:
a third dielectric layer disposed on the second dielectric layer such that the second dielectric layer is interposed between the third dielectric layer and the etch stop layer; and
another conductive feature disposed in the third dielectric layer and electrically coupled to the via.

8. The device of claim 1, wherein the conductive feature includes: a top surface, a side surface, and a curvilinear surface that extends from the top surface to the side surface, and wherein the via physically contacts the top surface, the side surface, and the curvilinear surface of the conductive feature.

9. A method comprising:
forming a conductive feature in a first dielectric layer disposed over a substrate;
depositing an etch stop layer on the first dielectric layer and the conductive feature, wherein a top surface of the etch stop layer adjacent the conductive feature is at a height different from another top surface of the etch stop layer directly over the first dielectric layer;
depositing a second dielectric layer over the etch stop layer;
performing a first etching process to define a track trench within the second dielectric layer;
forming a material on the second dielectric layer and within the track trench;
performing a second etching process to the second dielectric layer and the etch stop layer to form a via hole that extends through the material within the track trench to expose the conductive feature; and
forming a via in the via hole.

10. The method of claim 9, wherein the performing of the second etching process to the second dielectric layer and the etch stop layer is configured such that an etch rate of the second dielectric layer is faster than an etch rate of the etch stop layer.

11. The method of claim 9, wherein the depositing of the etch stop layer is configured such that the another top surface of the etch stop layer directly over the first dielectric layer is lower than a top surface of the conductive feature when the second dielectric layer is deposited.

12. The method of claim 9, wherein the forming of the conductive feature in the first dielectric layer includes recessing the first dielectric layer such that a portion of the conductive feature protrudes above the first dielectric layer.

13. The method of claim 9, wherein the via hole exposes a top surface and a side surface of the conductive feature.

14. The method of claim 13, wherein the forming of the via is configured such that the via physically contacts the top surface and the side surface of the conductive feature.

15. The method of claim 14, wherein the etch stop layer is disposed between a portion of the via that physically contacts the side surface of the conductive feature and the second dielectric layer.

16. A method comprising:
providing a device that includes:
a substrate;
a first dielectric layer disposed over the substrate; and
a conductive feature disposed in and extending above the first dielectric layer;
forming an etch stop layer on the first dielectric layer and the conductive feature, the etch stop layer having a conformal cross-sectional profile such that a first portion of the etch stop layer disposed over the conductive feature has a top surface at a first height, and a second portion of the etch stop layer has a top surface at a second height that is less than the first height;
depositing a second dielectric layer over the etch stop layer;
performing a lithographic process to define a via hole, wherein the etch stop layer includes a side portion of the etch stop layer extending between the top surface of the first portion and the top surface of the second portion;
etching the second dielectric layer and the etch stop layer to form a via hole that exposes the conductive feature; and
forming a via in the via hole, wherein the via hole is such that the via in the via hole has a bottommost surface and an entirety of the bottommost surface of the via physically contacts the side portion of the etch stop layer.

17. The method of claim 16, wherein the forming of the etch stop layer is configured such that the top surface of the second portion of the etch stop layer is below a top surface of the conductive feature when the second dielectric layer is deposited.

18. The method of claim 16, wherein the etching the second dielectric layer and the etch stop layer is configured such that an etch rate of the second dielectric layer is at least three times an etch rate of the etch stop layer.

19. The method of claim 16 further comprising depositing a third dielectric layer on the second dielectric layer such that the second dielectric layer is disposed between the third dielectric layer and the etch stop layer.

20. The method of claim 19 further comprising forming another conductive feature in the third dielectric layer that is electrically coupled to the via.

* * * * *